(12) United States Patent
Hsiung et al.

(10) Patent No.: US 6,174,812 B1
(45) Date of Patent: Jan. 16, 2001

(54) COPPER DAMASCENE TECHNOLOGY FOR ULTRA LARGE SCALE INTEGRATION CIRCUITS

(75) Inventors: Chiung-Sheng Hsiung; Wen-Yi Hsieh, both of Hsin-Chu; Water Lur, Taipei, all of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/328,246

(22) Filed: Jun. 8, 1999

(51) Int. Cl.⁷ ..................................... H01L 21/44
(52) U.S. Cl. .................. 438/687; 438/632; 438/661; 438/672; 438/678; 438/680; 438/681; 438/685; 438/687
(58) Field of Search ................... 438/661, 632, 438/672, 687, 678, 685, 680, 681

(56) References Cited

U.S. PATENT DOCUMENTS

| | | | |
|---|---|---|---|
| 5,654,232 | * 8/1997 | Gardner | 438/661 |
| 5,695,810 | * 12/1997 | Dubin et al. | 427/96 |
| 5,824,599 | * 10/1998 | Schacham-Diamond et al. | 438/678 |
| 5,925,206 | * 7/1999 | Boyko et al. | 156/150 |

\* cited by examiner

Primary Examiner—David Nelms
Assistant Examiner—Reneé R. Berry
(74) Attorney, Agent, or Firm—Harness, Dickey & Pierce, P.L.C.

(57) ABSTRACT

A copper-palladium alloy damascene technology applied to the ultra large scale integration (ULSI) circuits fabrication is disclosed. First, a TaN barrier is deposited over an oxide layer or in terms of the inter metal dielectric (IMD) layer. Then a copper-palladium seed is deposited over the TaN barrier. Furthermore, a copper-palladium gap-fill electroplating layer is electroplated over the dielectric oxide layer. Second, a copper-palladium annealing process is carried out. Then the copper-palladium electroplating surface is planarized by means of a chemical mechanical polishing (CMP) process. Third, the CoWP cap is self-aligned to the planarized copper-palladium alloy surface. Finally, a second IMD layer is deposited over the first IMD layer. Furthermore, a contact hole in the second dielectric layer over said CoWP cap layer is formed, and then the CoWP cap of the first IMD layer is connected with the copper-palladium alloy bottom surface of the second IMD layer directly. The other deposition processes are subsequently performed the same way.

12 Claims, 6 Drawing Sheets

COPPER DAMASCENE TECHNOLOGY FOR ULTRA LARGE SCALE INTEGRATION CIRCUITS

BACKGROUND OF THE INVENTION

1. Field of the Invention

The present invention relates to a method for forming ultra large scale integration circuits (ULSI), and, more particularly, to a method for a copper-palladium alloy damascene technology applied to the ULSI circuit fabrication.

2. Description of the Prior Art

Copper has become a promising material to replace aluminum for Ultra Large Scale Integration Circuits (ULSI) interconnection due to its better conductivity and reliability. However, several difficulties are encountered owing to the current process flow of dual damascene and inherent physical properties of copper, as illustrated in FIG. 1A to FIG. 1E. First, after the copper gap-fill electroplating, the high temperature furnace annealing suffers low throughput and potential oxidation hazard since copper is easily and quickly oxidized at low temperature, and, unlike aluminum, forms no self-protective oxide layer to prevent further oxidation. Formation of oxide compounds degrades the electrical and mechanical properties of copper. Second, peeling issues between capped $Si_3N_4$ barrier and copper/dielectrics may occur because of bad adhesion. Third, for the present etching process to be used, copper will be exposed during the via etching step in opening low conductivity $Si_3N_4$ barrier and potentially cause the device degradation.

An example of a typical copper damascene technology for ULSI circuits fabrication process steps is shown in FIG. 1A to FIG. 1E.

Referring to FIG. 1A and FIG 1B, a copper seed 12 is deposited over an oxide layer 10 by means of a barrier TaN 11, and then a copper gap-fill electroplating layer 13 is electroplated over the oxide layer 10, which is used as an inter metal dielectric (IMD) layer 10.

Next, a copper 13 annealing process is carried out in the ambient $N_2$. So far as is known, copper 13 is an easily oxidation material so the annealing process must proceed in the ambient $N_2$ to prevent the oxidation reaction, and then unload the device at the low temperature. The temperature reducing period is in terms of oxidation throughput. The higher oxidation throughput means for the higher taking out temperature. By the way, benefits include reducing the annealing time and cost.

Referring to FIG. 1C, a chemical mechanical polishing (CMP) process is carried out by planarizing the copper plating surface 13.

Referring to FIG. 1D, the $Si_3N_4$ cap 14 is deposited over the planarized Cu surface 12 to protect it. However, it will face the peeling issues between capped $Si_3N_4$ barrier 14 and copper 13/dielectrics 10 which may occur because of bad adhesion.

Referring to FIG. 1E, another inter metal dielectric (IMD) layer 15 is formed over the $Si_3N_4$ cap layer 14 of the first IMD layer, and then proceeding the via etching step over the $Si_3N_4$ cap layer 14 to connect the first IMD layer 10 and the second IMD layer 15. For the present etching process to be used, copper will be exposed to the IMD layer 15 during the via etching step in opening the low conductivity $Si_3N_4$ barrier 14 and potentially cause the device short or degradation owing to the high diffusivity of copper 13.

The above problems are hindrances of copper damascene technology for VLSI circuits progress. Now a copper-palladium method is presented to solve those issues as follows.

SUMMARY OF THE INVENTION

In accordance with the present invention, a method is provided for alloying copper with palladium, for instance, to resolve the aforementioned difficulties. Doped palladium can expand and expedite the process of high temperature annealing and also serve as an activator for the post chemical mechanical polishing (CMP) barrier capping, allowing the copper diffusion barrier like CoWP being selectively and exclusively deposited on copper interconnect. The advantages of this self-aligned process include reduction of inter metal dielectric (IMD) capacitance and elimination of the peeling problem between barrier and interconnects/dielectrics. In addition, exposure of copper during via etching can be also minimized since CoWP offers low resistivity (~30 $\mu$Ohms-cm) and can thus be preserved for interconnection.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
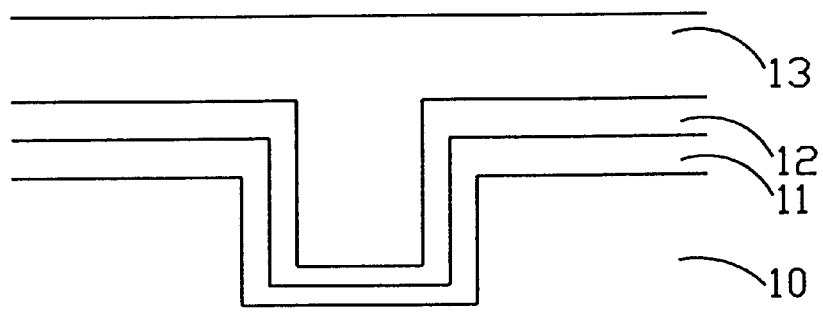
FIG. 1A to FIG. 1E show fabrication process steps illustrative of the traditional copper damascene technology for ULSI circuits.
Figure 1B:
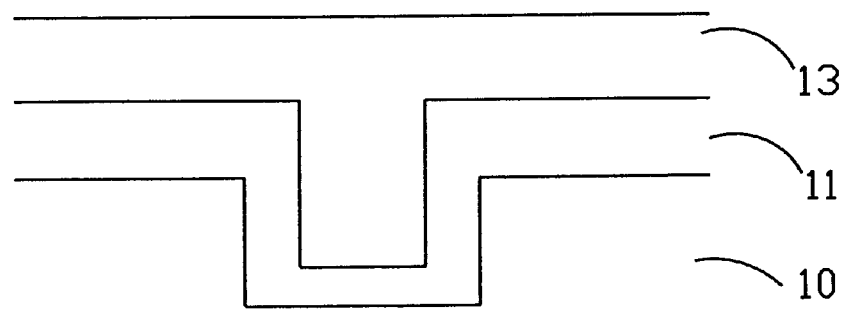
Figure 1C:
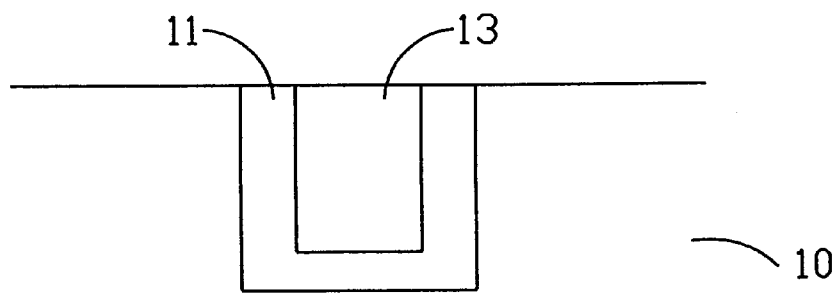
Figure 1D:
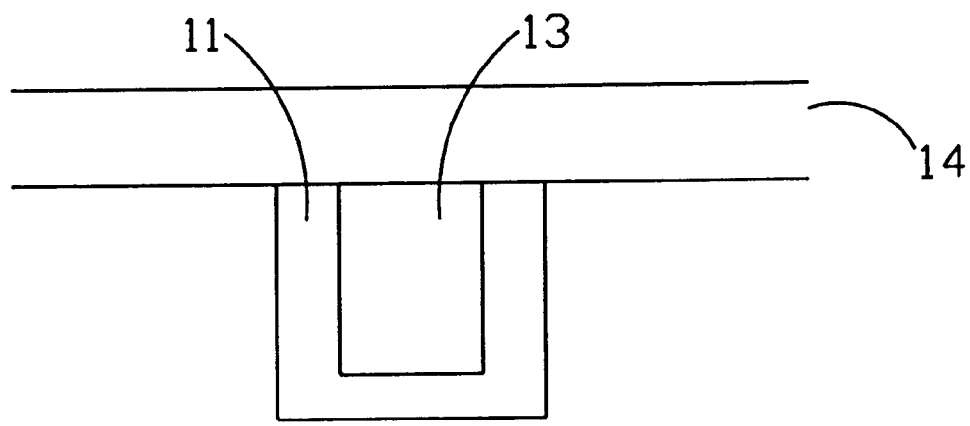
Figure 1E:
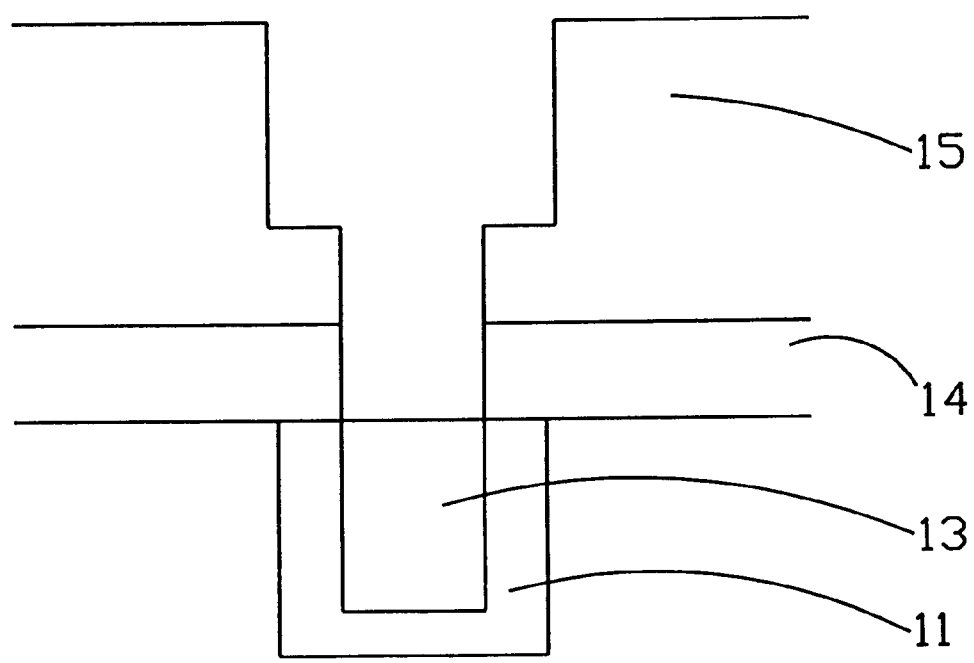
Figure 2A:
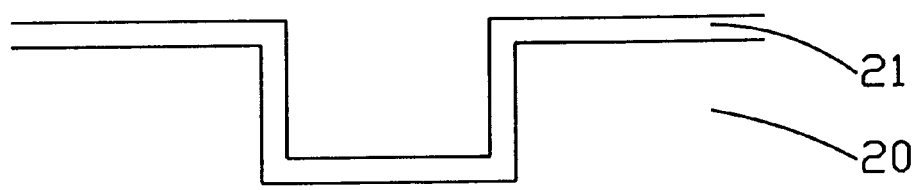
FIG. 2A to FIG. 2E show fabrication process steps illustrative of a copper-palladium alloy damascene technology for ULSI circuits with one embodiment of the present invention.

According to the first embodiment, a method is discussed for forming ultra large scale integration circuits (ULSI), and providing the detailed steps for a copper-palladium alloy damascene technology applied to the ULSI circuits fabrication. Referring to the FIG. 2A to FIG. 2E, the present invention comprises the following steps:

First, referring to FIG. 2A, a TaN barrier 21 is deposited over an oxide layer gap 20 substrate, which is used as an inter metal dielectric [IMD or ILD] layer gap 20.

Figure 2B:
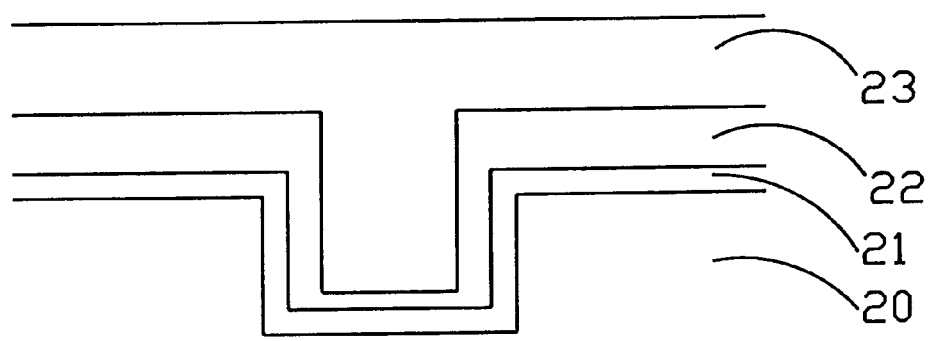

As shown in FIG. 2B, a copper-palladium seed 22 is deposited over the TaN barrier 21. And then a copper-palladium alloy gap-fill electroplating layer 23 is electroplated over the IMD layer 20 gap owing to the excellent compatibility for copper and palladium.

Next, a copper-palladium is carried out through an annealing process. The Cu—Pd alloy layer 23 has a higher throughput than the Cu layer 13 mentioned in the prior art owing to the Pd composition. By the way, this reduces annealing time and cost. Furthermore, the annealing step is undertaken in the ambient $N_2$ to prevent copper-palladium alloy oxidation.

Figure 2C:
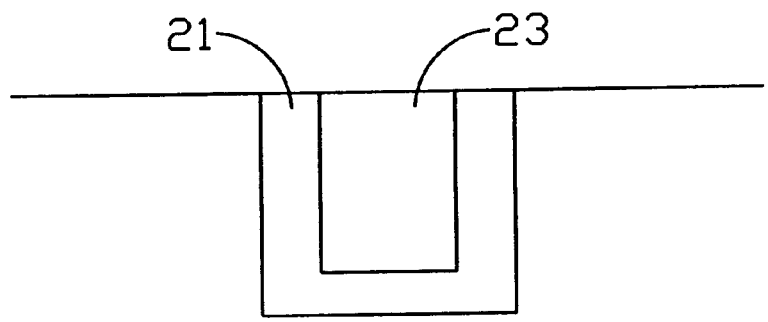

As shown in FIG. 2C, the copper-palladium electroplating surface 23 is planarized by means of a chemical mechanical polishing process.

Figure 2D:
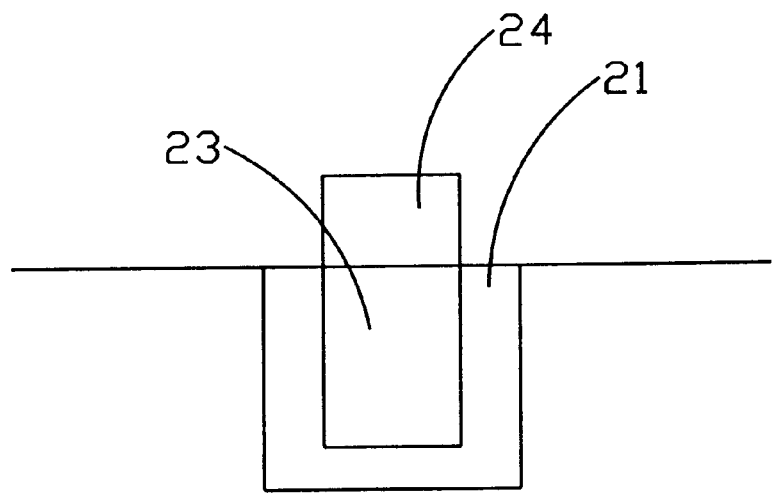

As shown in FIG. 2D, Pd is the activator (catalyst) for the self oxidation-reduction reaction (electroless planting reaction), CoWP 24 is selectively and exclusively deposited on copper interconnect. The advantages of this self-aligned process include reduction of IMD capacitance and elimination of the peeling problem between cap barrier and interconnects/dielectrics. In addition, exposure of copper during via etching can be also minimized since CoWP 24 offers low resistivity (~30 $\mu$Ohms-cm) and can thus be preserved for interconnection.

Figure 2E:
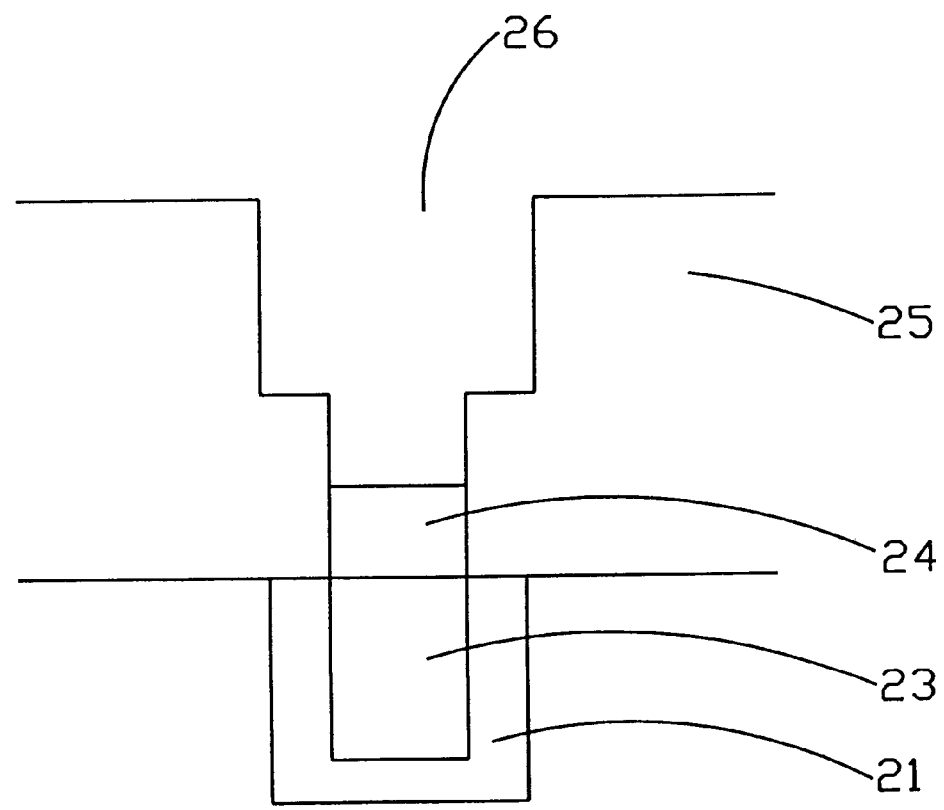

As shown in FIG. 2E, a second inter metal dielectric layer 25 is deposited over the first inter metal dielectric layer 20. And then a contact hole 26 of said second dielectric layer 20 is formed over the top surface of said cap layer 24. The other deposition processes are subsequently performed by the same way.

Figure 3A:
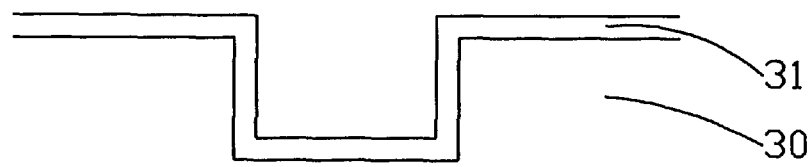
FIG. 3A to FIG. 3F show fabrication process steps illustrative of copper-palladium alloy damascene technology for ULSI circuits with another embodiment of the present invention.

According to another embodiment, a method is disclosed for forming ultra large scale integration circuits (ULSI), and providing the detailed steps for a copper plating layer and then palladium sputtering to produce excellent compatibility for copper and palladium, a homogeneous Cu—Pd alloy is obtained after high temperature annealing. This Cu—Pd alloy damascene technology is applied to the ULSI circuit fabrication. Referring to FIG. 3A to FIG. 3E, the present invention comprises the following steps:

First, referring to FIG. 3A, a TaN barrier 31 is deposited over an oxide layer gap 30 substrate, which is used as an inter metal dielectric (IMD) layer gap 30.

Figure 3B:
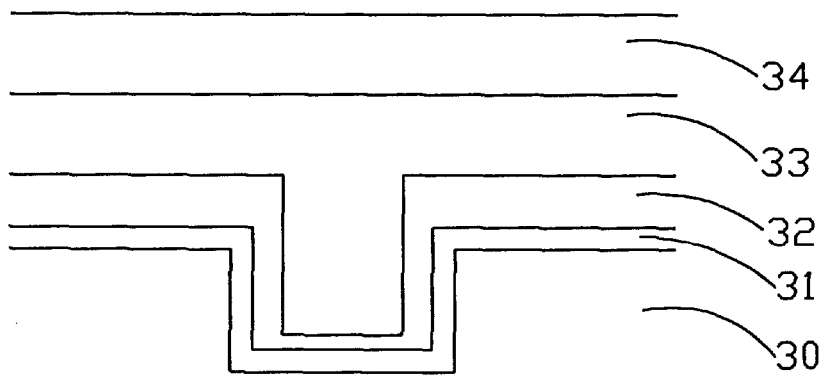

As shown in FIG. 3B, a copper seed layer 32 is deposited over the TaN barrier 31. Next, a copper gap-fill electroplating layer 33 is electroplated over the IMD layer gap 30. Then, a palladium layer 34 is sputtered over the copper layer 33.

Figure 3C:
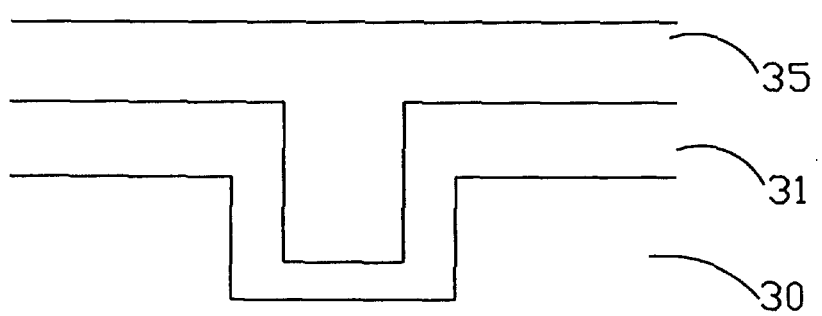

As shown in FIG. 3C, the copper-palladium layer 33 is performed an annealing process. Owing to the excellent compatibility of copper and palladium a homogeneous Cu—Pd alloy 35 layer is formed. The homogeneous Cu—Pd alloy layer 35 has a higher throughput than the Cu layer 13 mentioned in the prior art depends on the Pd composition. By the way, this will reduce the annealing time and cost. Furthermore, the annealing step is held in the ambient $N_2$ to prevent copper-palladium alloy oxidation.

Figure 3D:
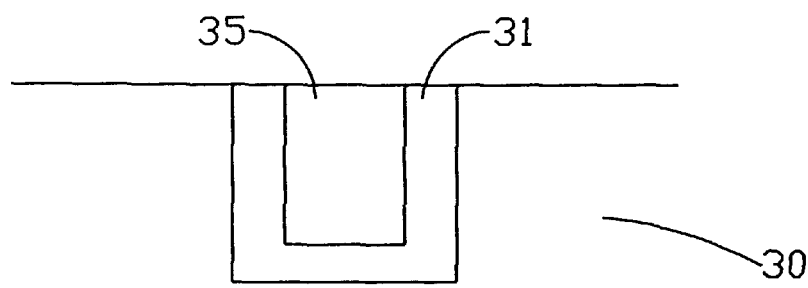

As shown in FIG. 3D, the copper-palladium electroplating surface 35 is planarized by means of a chemical mechanical polishing process.

Figure 3E:
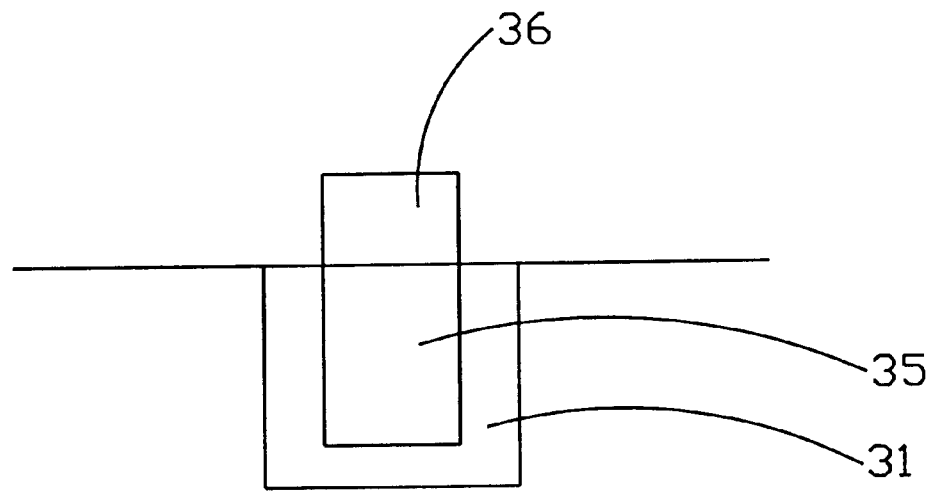

Referring to FIG. 3E, CoWP cap layer 36 is selectively and exclusively deposited on the copper-palladium alloy 35 surface. The advantages of this self-aligned step include reduction of IMD capacitance and elimination of the peeling problem between barrier and interconnects/dielectrics. In addition, exposure of copper during via etching can be also minimized since CoWP 36 offers low resistivity (~30 $\mu$Ohms-cm) and can thus be preserved for interconnection.

Figure 3F:
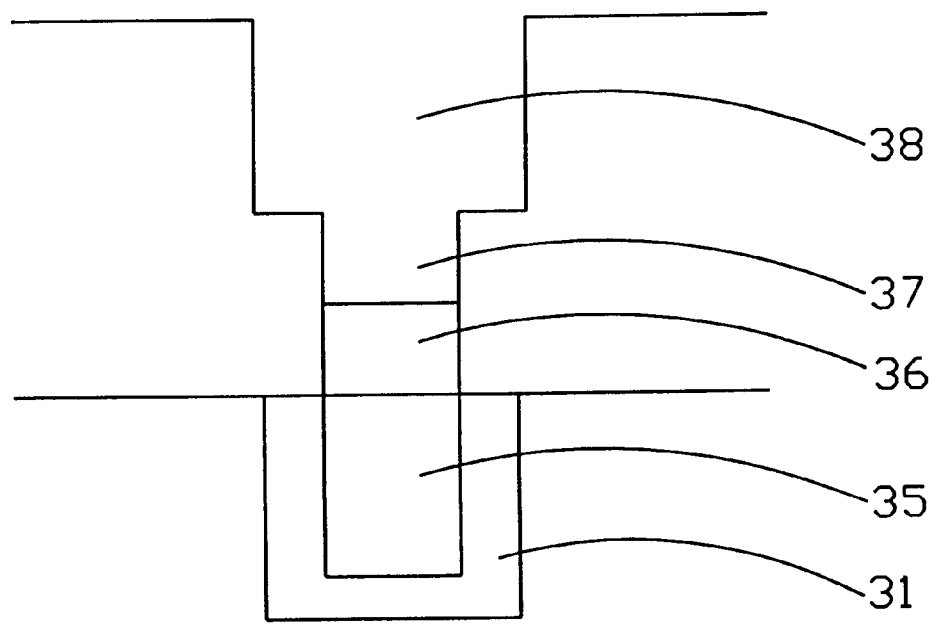

As shown in FIG. 3F, a second IMD layer 38 is deposited over the first IMD layer 30. A contact hole 37 is then formed in the second dielectric layer 38 over the cap layer 36. The CoWP cap 36 of the first IMD layer 30 is connected with the copper-palladium alloy 37 bottom surface of the second IMD layer 38 directly. The other deposition processes are subsequently performed the same way.

The process flow for this invention is schematically illustrated in FIG. 2 and FIG. 3. Electrochemical deposition (ECD) method is currently used for filling copper in the damascene process and can be also applied for Cu—Pd alloy deposition. ECD technology allows Cu—Pd being co-deposited on the copper seed layer with underlying TaN barrier. As an alternative, copper can be amalgamated by Pd chemical treatment or Pd sputtering on the surface after gap-filled ECD copper process. A homogeneous Cu—Pd alloy is obtained after subsequent high temperature alloying. Cu—Pd alloy is then planarized and selectively deposited on the palladium activated copper lines.

Finally, the Cu—Pd composition ratio is a try-error technique for the total process. Pd prevents Cu oxidation in the high temperature annealing and Cu favor conductivity. To find the optimal ratio is the key point of the Cu—Pd alloy damascene technology. From the theory estimation the Pd composition is no more than 10%.

Although specific embodiments have been illustrated and described, it will be obvious to those skilled in the art that various modifications may be made without departing from what is intended to be limited solely by the appended claims.

What is claimed is:

1. A method of forming a copper-palladium alloy damascene for ultra large scale integration circuits, said method comprising:

conformably forming a barrier layer on bottom and sidewall surface of a dielectric layer gap;

forming a metal seed layer over the barrier layer;

forming a copper-palladium electroplating layer over the metal seed layer to fill the dielectric layer gap;

gas annealing said copper-palladium electroplating layer;

planarizing the copper-palladium electroplating layer until the dielectric layer is exposed;

forming a cap layer over the planarized copper-palladium electroplating layer;

forming a second dielectric layer over the dielectric layer; and forming a contact hole in said second dielectric layer over said cap layer.

2. The method according to claim 1, wherein said dielectric layer comprising an oxide layer.

3. The method according to claim 1, wherein said barrier layer comprising a TaN barrier layer.

4. The method according to claim 1, wherein said seed barrier layer comprising a copper-palladium seed barrier layer.

5. The method according to claim 1, wherein said planarizing step comprising a chemical mechanical polishing step.

6. The method according to claim 1, wherein said annealing step is hold in the ambient $N_2$ to prevent copper-palladium alloy oxidation.

7. The method according to claim 1, wherein said cap layer comprising a CoWP cap layer.

8. The method according to claim 1, wherein said cap layer is self-aligned to the copper-palladium electroplating layer by a palladium activator for a self oxidation reduction reaction or electrochemical deposition.

9. A method of forming a copper-palladium alloy damascene for ultra large scale integration circuits, said method comprising:

conformably forming a TaN barrier layer on bottom and sidewall surface of a dielectric layer gap;

forming a copper seed layer over the TaN barrier layer;

forming a copper gap-fill electroplating layer over the dielectric layer;

conformably sputtering a palladium layer over said copper electroplating layer followed by a nitrogen gas annealing step to form a copper-palladium alloy;

planarizing said copper-palladium alloy by a chemical mechanical polishing step;

capping a CoWP cap layer over the planarized copper-palladium alloy surface;

forming a second dielectric layer over the dielectric layer; and forming a contact hole in said second dielectric layer over said cap layer.

10. The method according to claim 9, wherein said dielectric layer comprising an oxide layer.

11. The method according to claim 9, wherein said annealing step is hold in the ambient $N_2$ to prevent copper-palladium alloy oxidation.

12. The method according to claim 9, wherein said CoWP cap layer is self-aligned to the copper-palladium alloy by a palladium activator for a self oxidation reduction reaction or electrochemical deposition.

* * * * *